United States Patent
Zanotto et al.

(10) Patent No.: US 9,324,928 B2
(45) Date of Patent: Apr. 26, 2016

(54) LIGHTING DEVICE AND CORRESPONDING METHOD

(71) Applicant: OSRAM GmbH, Munich (DE)

(72) Inventors: Alberto Zanotto, Padua (IT); Alessio Griffoni, Venice (IT); Simone Massaro, Venice (IT)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/480,650

(22) Filed: Sep. 9, 2014

(65) Prior Publication Data
US 2015/0069452 A1 Mar. 12, 2015

(30) Foreign Application Priority Data
Sep. 9, 2013 (IT) .............................. TO2013A0728

(51) Int. Cl.
*H01L 29/00* (2006.01)
*H01L 33/62* (2010.01)
(Continued)

(52) U.S. Cl.
CPC . *H01L 33/62* (2013.01); *F21K 9/90* (2013.01); *F21V 19/005* (2013.01); *F21V 23/005* (2013.01); *F21V 31/005* (2013.01); *H01L 33/005* (2013.01); *H01L 33/483* (2013.01); *H01L 33/56* (2013.01); *F21Y 2101/02* (2013.01); *H01L 2224/16225* (2013.01); *H01L 2933/005* (2013.01); *H01L 2933/0033* (2013.01)

(58) Field of Classification Search
CPC ..... F21V 23/005; F21V 29/004; F21V 31/04; F21V 15/01; F21V 29/507; F21V 29/87; F21V 31/005; H05K 2201/10106; H05K 3/284; H05K 1/16; H05K 1/185; H05K 2203/1316; H01L 24/24
See application file for complete search history.

(56) References Cited

U.S. PATENT DOCUMENTS 7,722,211 B2   5/2010   Marra et al.
2007/0121326 A1   5/2007   Nall et al.
(Continued)

FOREIGN PATENT DOCUMENTS

CN   201680181 U   12/2010
DE   102011017790 A1   10/2012
(Continued)

OTHER PUBLICATIONS

European Office Action based on Application No. 14 183 688.2(7 Pages) dated Jan. 29, 2016.

*Primary Examiner* — Roy Potter
*Assistant Examiner* — Paul Patton
(74) *Attorney, Agent, or Firm* — Viering, Jentschura & Partner mbB

(57) ABSTRACT

A lighting device may include a mounting board with first and second opposed faces and vias extending therethrough, one or more light radiation sources mounted on the first face of the mounting board, drive circuitry for the light radiation source mounted on the second face of the mounting board, with electrically conductive lines between the light radiation source and the drive circuitry passing through said vias, a vat-like holder housing the mounting board with the light radiation source and the drive circuitry mounted thereon. The holder has cavities for receiving therein the drive circuitry with the first face of the mounting board and the light radiation source mounted thereon facing outwardly of the holder. Over the first face of the mounting board at least one sealing layer is applied, which ensures an IP grade protection of device.

10 Claims, 2 Drawing Sheets

(51) Int. Cl.

| | | |
|---|---|---|
| *F21V 31/00* | (2006.01) | |
| *F21K 99/00* | (2016.01) | |
| *F21V 19/00* | (2006.01) | |
| *F21V 23/00* | (2015.01) | |
| *H01L 33/00* | (2010.01) | |
| *H01L 33/48* | (2010.01) | |
| *H01L 33/56* | (2010.01) | |
| *F21Y 101/02* | (2006.01) | |

(56) References Cited

U.S. PATENT DOCUMENTS

| | | |
|---|---|---|
| 2007/0242462 A1 | 10/2007 | Van Laanen et al. |
| 2008/0232119 A1* | 9/2008 | Ribarich ............... 362/373 |
| 2012/0069579 A1* | 3/2012 | Koh et al. ............. 362/307 |
| 2012/0140437 A1 | 6/2012 | Kim et al. |
| 2012/0287582 A1 | 11/2012 | Vinciarelli et al. |
| 2014/0042489 A1 | 2/2014 | Preuschl |
| 2014/0252946 A1* | 9/2014 | Fujita et al. ............. 315/51 |

FOREIGN PATENT DOCUMENTS

| | | |
|---|---|---|
| EP | 2124255 A1 | 11/2009 |
| EP | 2273189 A1 | 1/2011 |
| JP | 2007311760 A | 11/2007 |
| WO | 2013064343 A1 | 5/2013 |

* cited by examiner

LIGHTING DEVICE AND CORRESPONDING METHOD

CROSS-REFERENCE TO RELATED APPLICATION

This application claims priority to Italian Patent Application Serial No. TO2013A000728, which was filed Sep. 9, 2013, and is incorporated herein by reference in its entirety.

TECHNICAL FIELD

Various embodiments relate generally to lighting devices.

Various embodiments may refer to Solid State Lighting (SSL) devices, such as lighting devices which make use of LED sources.

BACKGROUND

Various implementations of solid state lighting modules are known (for example flexible LED modules) in which the electrical and electronic components (light radiation source(s), resistors, capacitors, LED drivers etc.) are mounted on a single side of a board (e.g. similar to a Printed Circuit Board, PCB). In such implementations, all components therefore are located on the side which is visible to the end user, with possible disadvantages of various kinds.

For example, there may be limitations in the choice of the electrical and electronic components: if the number of such components is high, the radiation pattern may be uneven, with a consequent reduction of the device efficiency.

The electrical/electronic components are usually black or dark, and this colour may eventually produce visible black spots when the lighting module is off.

On the one side, it might be possible to ask suppliers to produce components with a white or other light colour package; this however might cause an increase in costs.

The drawback might also be limited by covering the dark components with a coating, for example a silicone coating, of a white colour, without covering the light radiation sources, also taking into account the fact that the sealing from the outer environment (IP protection) may be achieved with a two-step process:

a first step, in which the board surface is covered by e.g. a silicone layer, of a white colour, so as to cover the dark components, without covering the Light Emitting Surface(s) (LES);

a second step, in which the whole surface of the board (including what has already been covered with the white layer) is coated with a further transparent, i.e. light-permeable, layer (e.g. a silicone layer), so as to ensure an efficient light transmission while achieving an IP protection (Ingress Protection Rating) as well.

In order to simplify the process, and specifically the first step thereof, the light radiation sources (which must remain exposed) and the drive circuitry (which on the contrary must be covered and masked by a white layer) must not be present in too high a number.

Moreover, in various implementations, such a process may impose limitations in the choice of sources, e.g. because of the difficulty of using LEDs with high performance and reliability and low cost.

More generally speaking, another constraint may come from the fact that the LED-to-LED pitch is influenced by the space needed to mount the other electrical and electronic components.

SUMMARY

Various embodiments aim at overcoming the previously outlined drawbacks.

Various embodiments may offer one or several of the following advantages:

only the light radiation sources (e.g. the LEDs) are visible from the outside of the final product;

a wide range of light radiation sources (e.g. LEDs) may be used, with advantages in terms of cost;

the silicone deposition process is simpler and more rapid, with the possibility of achieving productivity increases by about 50%, less silicone may be used for the module protection, thereby reducing the cost of raw materials;

it is possible to achieve modules with reduced thickness and/or reduced LED-to-LED pitch, in comparison with current implementations, a higher number of electronic components (twice as many) may be mounted.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various embodiments of the disclosure are described with reference to the following drawings, in which.

DESCRIPTION

In the following description, numerous specific details are given to provide a thorough understanding of various exemplary embodiments. One or more embodiments may be practiced without one or several specific details, or with other methods, components, materials, etc. In other instances, well-known structures, materials, or operations are not shown or described in detail to avoid obscuring aspects of the embodiments. Reference throughout this specification to "one or more embodiments" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The sequence of FIGS. 1 to 4 shows subsequent steps of a method for obtaining, according to various embodiments, a lighting device 10 which makes use, as a light radiation source 12, of a solid state source, such as a LED source (either single or plural: for simplicity, the figures refer to a single source 12).

In various embodiments, the source 12 may be mounted on a board 14, substantially similar to a printed circuit board.

In various embodiments, the board 14 may be made of an electrically insulating material, e.g. (optionally flexible) polyimide.

In various embodiments, as exemplified in the Figures, the board 14 may have two opposite faces, on which there are formed, according to known criteria, conductive lines 16 (of an electrically conductive material, e.g. copper) that are adapted to define transmission paths for electrical (supply and/or control) signals which connect the source 12 to drive circuits, which are denoted on the whole by 18.

Figure 1:
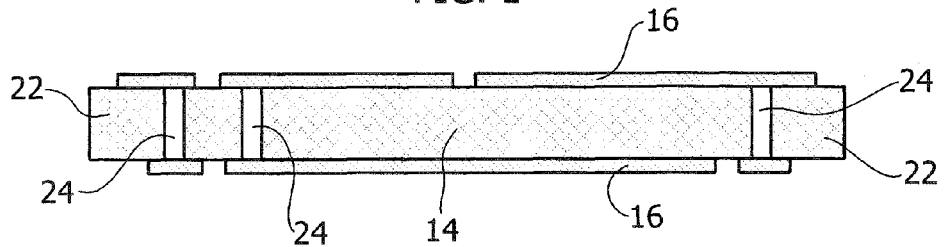
FIGS. 1 to 4 show subsequent steps of a method to achieve devices according to various embodiments.
Figure 2:
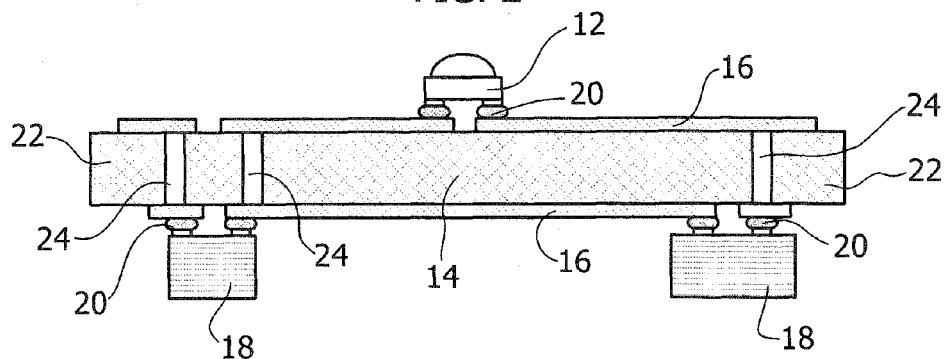

In various embodiments, the source 12 and the components 18 may be connected (optionally also mechanically) to the lines 16 by soldering and/or via an electrically conductive adhesive, as schematically shown at 20 in FIG. 2 and the following Figures.

The nature of the electrical/electronic components 18, as well as the topology of the conductive lines 16, are not of particular relevance to various embodiments. The same may be true, for example and with no limitations, for the masks which define the paths of the conductive lines 16.

In various embodiments, through the body of board 14 (the side edges whereof are denoted with 22) there may extend lines or connection "vias" 24 for the electrical connection between the source 12, mounted on the "front" face of the board 14, and the drive circuits 18, which on the contrary are mounted on the "back" face of board 14. In this way, on the front face of the board 14, only the light radiation source(s) 12 is/are visible from the outside, while the drive circuits 18, mounted on the opposite face, i.e. on the back face, are hidden from the outside.

In various embodiments a lighting module or device 10 is implemented that has an IP protection grade, and which may be flexible or "flex", thanks to the flexibility of the board 14.

In various embodiments, the components 18 may be mounted on the back face of the board 20, for example via standard methods such as SMD processes and/or by using electrically conductive adhesives or soldering masses, possibly in combination (for example soldered/welded layers and conductive adhesive layers coated in sequence).

In various embodiments, it is possible to use a generally vat-like holder 28, e.g. including silicone-based, and therefore flexible material of a generally white colour. Such a holder may be produced e.g. by extrusion or molding.

In various embodiments, the holder 28 can be provided, e.g. in the bottom wall, with cavities 30 adapted to accommodate the circuits 18 mounted on the back face of board 26.

In various embodiments, this enables to match the shape of the holder 28 and the shape of the "bare" module (i.e. the board 14 with the source(s) 12 and components 18 mounted on the opposite faces thereof).

Figure 3:
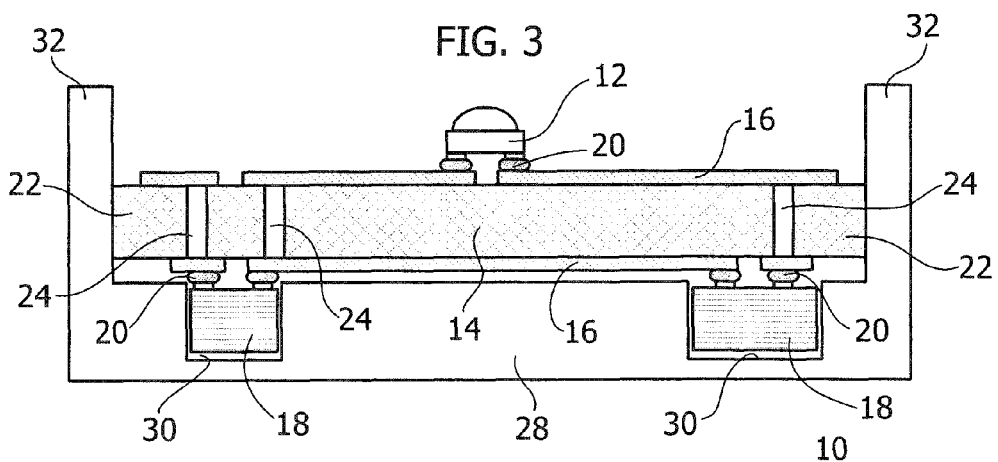

In various embodiments, this bare module may be inserted into the holder 28, as schematically shown in FIG. 3, and then the bare module may be glued to holder 28.

In various embodiments, the holder 28 may have a general vat shape with a bottom wall (where the cavities 30 may be arranged) and peripheral walls 32 adapted to surround the basic module (board 14, light radiation source(s) 12 and components 18) in conditions wherein the side edges 22 of the board 14 contact the side walls 32 of the holder 28, or at least are adjacent to them.

The figure exemplifies various embodiments wherein it is possible to achieve a sealing of the circuit 10, providing it with a protection grade (for example IP) against the penetration of external agents, without having to perform two subsequent steps of applying, first of all, a white sealing mass (e.g. silicone-based), and then a transparent (i.e. light-permeable) mass, according to the criteria recalled in the introduction of the present application.

Figure 4:
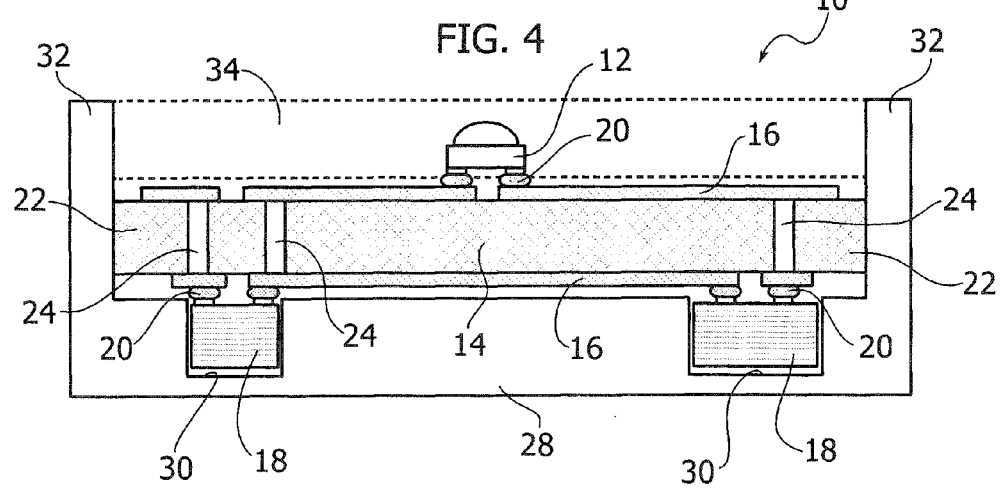

In FIG. 4 there is shown the possibility, in various embodiments, of achieving a sealing from the environment by applying a single transparent (i.e. light-permeable) sealing mass 34, thereby implementing one single step and reducing the related costs.

As schematically depicted in FIG. 4, in various embodiments the sealing mass or layer 34 may cover the whole front face of board 13 (including the light radiation source(s); being transparent, the layer 34 does not block light radiation), while sealingly connecting to the side walls 32 of the holder 28, i.e. while sealing the peripheral area where side edges 22 of the board 14 face (e.g. contact) the side walls 32 of the holder 28. In such embodiments, the sealing mass 34 may therefore extend beyond the contours of the soldering mask, i.e. to areas external to the paths of the lines 16.

Figure 5:
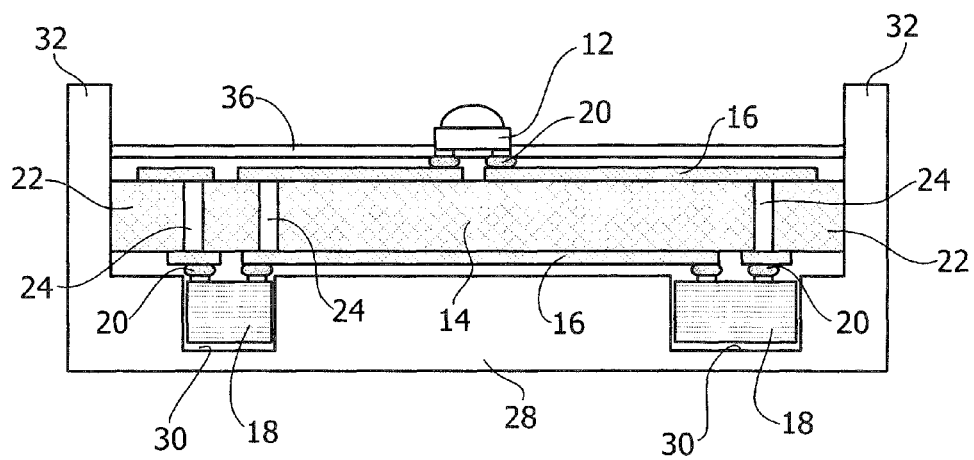
FIGS. 5 and 6 show variations of embodiments.
Figure 6:
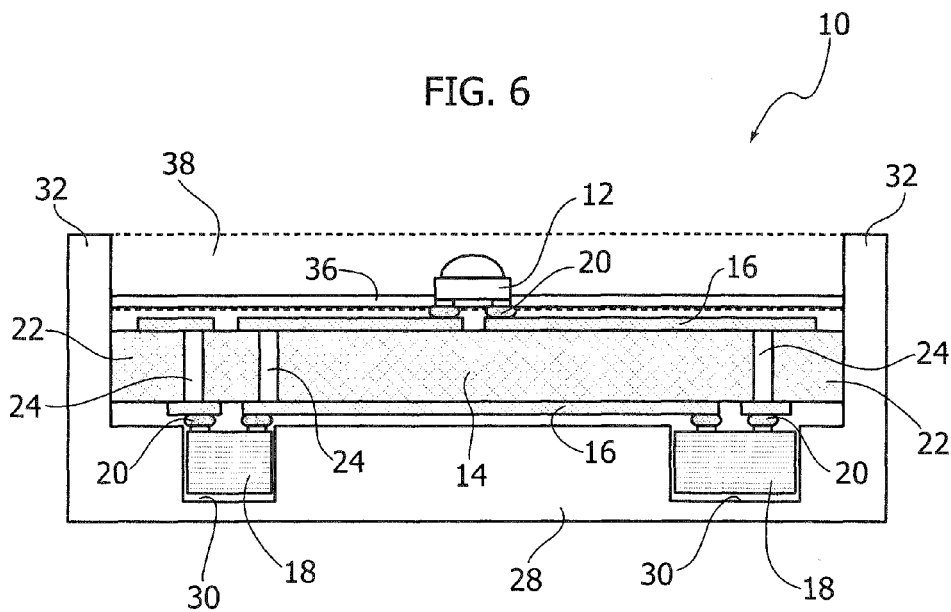

Instead of a single transparent sealing mass, such as mass 34, various embodiments, as exemplified in FIGS. 5 and 6, may make use of two sealing masses or layers:

the former, denoted by 36, being of a white colour, and the latter, denoted by 38, being transparent (and therefore light-permeable).

This allows to meet further requirements than in current implementations.

For example, FIG. 5 shows the possibility to apply a first thin sealing mass or layer 36 of a white colour, which is adapted to cover the front face of the board 26 while leaving the light radiation source(s) 12 exposed.

In various embodiments, on the front face of the board 14 there may be only provided the light radiation source(s) 12 (the drive circuits 18 being mounted on the back face); this simplifies the application of a layer 36 of reduced thickness, which leaves the source(s) 12 exposed while extending to cover the front face of the board 14 (and the conductive lines 16 provided thereon) with a substantially planar extension profile, which does not have to "wrap" any circuit component in order to mask it.

The possible use of a very thin layer 36 opens up a wide range of choice of the light radiation source(s) 12, enabling therefore the use of low-cost LEDs without taking into account factors such as the package size.

FIG. 6 exemplifies that, in various embodiments, on the layer 36 it is then possible to apply a subsequent transparent sealing layer 38, of a light-permeable material, which therefore, in the same way as the layer 34 described with reference to FIG. 4, may extend to cover the source(s) 12 as well without blocking the light emission by the device 10.

As in the case of the layer 34, in various embodiments the layer 36 and/or the layer 38 may connect sealingly with the side walls 32 of the holder 28, while sealing the peripheral area where the side edges 22 of the board 14 face (e.g. contact) the side walls 32 of the holder 28.

As a consequence, irrespective of the solution chosen, whether:

of a single transparent layer 34 which covers the source(s) 12 as well (FIG. 4), or of a first white layer 36 which leaves the source(s) 12 exposed (FIG. 5) and of a second transparent layer 38 which covers the source(s) 12 as well (FIG. 6), in various embodiments at least one sealing layer 34 or 38 is present which is made of light-permeable material, at least at the source(s).

Whatever the solution adopted, the application criteria of sealing layers/masses 34, 36, 38 correspond to solutions known per se, so that they do not require a detailed description herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A lighting device comprising:
   a mounting board with first and second opposed faces and vias extending therethrough,
   at least one electrically powered light radiation source mounted on the first face of the mounting board,
   drive circuitry for said at least one light radiation source mounted on the second face of the mounting board, with electrically conductive lines between said at least one light radiation source and said drive circuitry passing through said vias,
   a vat-like holder housing said mounting board with said at least one light radiation source and said drive circuitry mounted thereon, said holder having cavities for receiving therein said drive circuitry with the first face of the mounting board and said at least one light radiation source mounted thereon facing outwardly of the holder,
   wherein the peripheral wall of the vat-like holder extends beyond the first face of the mounting board, and
   at least one sealing layer extending over the first face of the mounting board.

2. The device of claim 1, wherein said at least one sealing layer is sealed to the peripheral wall of said vat-like holder.

3. The device of claim 1, wherein said at least one sealing layer is of a material permeable to light at least at said at least one light radiation source.

4. The device of claim 3, further comprising:
   a first sealing layer of a white color, which extends over the first face of the mounting board by leaving exposed said at least one light radiation source, and
   a second sealing layer of a material permeable to light radiation which extends over said first layer of a white color and over said at least one light radiation source.

5. The device of claim 1, wherein said cavities for receiving said driving circuitry are in the bottom wall of said vat-like holder.

6. The device of claim 1, wherein said at least one sealing layer includes a silicone material.

7. The device of claim 1, wherein said holder is of a white color.

8. The device of claim 1, wherein said holder includes a silicone material.

9. The device of claim 1, wherein said mounting board is flexible.

10. A method of producing a lighting device, comprising:
    providing a mounting board with first and second opposed faces and vias extending therethrough,
    mounting at least one electrically powered light radiation source on the first face of the mounting board,
    mounting drive circuitry for said at least one light radiation source on the second face of the mounting board by providing electrically conductive lines between said at least one light radiation source and said drive circuitry passing through said vias,
    arranging said mounting board with said at least one light radiation source and said drive circuitry mounted thereon in a vat-like holder having cavities for receiving therein said drive circuitry with the first face of the mounting board and said at least one light radiation source mounted thereon facing outwardly of the holder, wherein the peripheral wall of the vat-like holder extends beyond the first face of the mounting board, and
    forming at least one sealing layer extending over the first face of the mounting board.

\* \* \* \* \*